(12) United States Patent
Eder et al.

(10) Patent No.: US 9,397,273 B2
(45) Date of Patent: Jul. 19, 2016

(54) OPTOELECTRONIC DEVICES CONTAINING A CONVERTER CARRIER LAYER, AND METHODS OF PRODUCING AN OPTOELECTRONIC DEVICE CONTAINING A CONVERTER CARRIER LAYER

(71) Applicant: OSRAM Opto Semiconductors GmbH, Regensburg (DE)

(72) Inventors: Florian Eder, Erlangen (DE); Sven Pihale, Ellingen (DE)

(73) Assignee: OSRAM Opto Semiconductors GmbH (DE)

( * ) Notice: Subject to any disclaimer, the term of this patent is extended or adjusted under 35 U.S.C. 154(b) by 2 days.

(21) Appl. No.: 14/390,043

(22) PCT Filed: Apr. 2, 2013

(86) PCT No.: PCT/EP2013/056929
§ 371 (c)(1),
(2) Date: Oct. 2, 2014

(87) PCT Pub. No.: WO2013/150023
PCT Pub. Date: Oct. 10, 2013

(65) Prior Publication Data
US 2015/0115302 A1    Apr. 30, 2015

(30) Foreign Application Priority Data

Apr. 2, 2012 (DE) .......................... 10 2012 102 859

(51) Int. Cl.
*C08G 77/00* (2006.01)
*C08G 77/02* (2006.01)
*H01L 33/50* (2010.01)
(Continued)

(52) U.S. Cl.
CPC ............ *H01L 33/502* (2013.01); *C03C 14/006* (2013.01); *C09K 11/02* (2013.01); *C09K 11/7774* (2013.01); *H01L 33/005* (2013.01); *H01L 33/501* (2013.01); *H01L 33/644* (2013.01); *H01L 2924/0002* (2013.01); *H01L 2933/0041* (2013.01)

(58) Field of Classification Search
CPC ...... C08G 77/46; C08G 77/38; C08G 64/186; C08G 77/448; C08G 65/336; C09K 11/02; C09K 11/025; C09K 11/7774; G21K 4/00; C09D 5/22; C08K 5/0041; C09B 67/0061; H01L 33/502; H01L 33/501; H01L 33/005
See application file for complete search history.

(56) References Cited

U.S. PATENT DOCUMENTS 4,609,694 A * 9/1986 Morimoto ............ C01G 23/005
                                                252/516
4,665,111 A * 5/1987 Hussain ............... C08G 59/226
                                                523/428

(Continued)

FOREIGN PATENT DOCUMENTS

DE    10 2008 057 140 A1    5/2010
DE    10 2010 054 279 A1    6/2012
EP         2 034 002 A2     3/2009

*Primary Examiner* — Allen Parker
*Assistant Examiner* — Gustavo Ramallo
(74) *Attorney, Agent, or Firm* — DLA Piper LLP (US)

(57) ABSTRACT

An optoelectronic device includes a layer sequence having an active layer that emits electromagnetic primary radiation, and at least one converter carrier layer arranged in the beam path of the electromagnetic primary radiation. The at least one converter carrier layer includes converter particles and an inorganic-organic hybrid material and/or a silicate glass.

12 Claims, 4 Drawing Sheets (51) Int. Cl.
*C09K 11/02* (2006.01)
*C09K 11/77* (2006.01)
*H01L 33/00* (2010.01)
*C03C 14/00* (2006.01)
*H01L 33/64* (2010.01)

(56) References Cited

U.S. PATENT DOCUMENTS

| | | | |
|---|---|---|---|
| 6,005,141 A * | 12/1999 | Schneider | A23C 7/02 562/565 |
| 2008/0180018 A1 | 7/2008 | Minamoto et al. | |
| 2009/0173957 A1 * | 7/2009 | Brunner | C09K 11/7701 257/98 |
| 2009/0186433 A1 * | 7/2009 | Yamaguchi | C03B 19/063 438/26 |
| 2009/0294742 A1 | 12/2009 | Jang et al. | |
| 2010/0032082 A1 * | 2/2010 | Ho | B32B 27/40 156/222 |
| 2010/0059743 A1 | 3/2010 | Jun et al. | |
| 2010/0155666 A1 * | 6/2010 | Fujita | C03C 8/08 252/301.4 P |
| 2010/0200801 A1 * | 8/2010 | Ramasamy | C08K 3/38 252/74 |
| 2013/0094178 A1 * | 4/2013 | Huang | F21K 9/135 362/84 |
| 2014/0302425 A1 * | 10/2014 | Weiser | G03H 1/02 430/2 |
| 2015/0064552 A1 * | 3/2015 | Huang | H01M 4/366 429/212 |

* cited by examiner

OPTOELECTRONIC DEVICES CONTAINING A CONVERTER CARRIER LAYER, AND METHODS OF PRODUCING AN OPTOELECTRONIC DEVICE CONTAINING A CONVERTER CARRIER LAYER

TECHNICAL FIELD

This disclosure relates to optoelectronic devices comprising a converter carrier layer and two methods of producing an optoelectronic device comprising a converter carrier layer.

BACKGROUND

Optoelectronic devices such as, e.g., light-emitting diodes (LEDs) frequently comprise converter carrier layers such as, e.g., a casting compound with a converter material. Converter materials convert the radiation emitted by a radiation source into radiation having a changed, e.g., longer, wavelength. Heat is produced in addition to the emitted changed radiation. Conventional converter carrier layers have inadequate heat dissipation of the heat produced by the converter material. This produces a heat build-up in the converter carrier layers which leads to a reduction in the luminosity and to a change in the chromaticity coordinate and to premature failure of the LED. Particularly in the case of LEDs with a high energy efficiency (up to 150 lm/W) and a high target light yield, the heat cannot be dissipated efficiently enough by conventional converter carrier layers. In particular, to promote the use of LEDs as a standard illuminant, it is necessary for the LEDs to have a high energy efficiency.

Therefore, it could be helpful to provide an optoelectronic device comprising a converter carrier layer having improved thermal conductivity.

SUMMARY

We provide an optoelectronic device including a layer sequence having an active layer that emits electromagnetic primary radiation; at least one converter carrier layer arranged in the beam path of the electromagnetic primary radiation, wherein 1) the at least one converter carrier layer includes converter particles and an inorganic-organic hybrid material produced by hydrolysis, mutual condensation and crosslinking at least of a compound of Formulae I' or I" and at least one compound of Formula II:

where M and M' are the same or different and can represent a central atom with the charge m or m', where R and R' are the same or different and represent hydrogen and/or an organic residue, where Y represents an organic residue having a reactive group suitable for crosslinking, where x=m and where 0<n<m', 1<x'<m' and x'+n=m', where a=2, 3, 4, 5, 6, 7 or 8, where b and b' are the same or different and b, b'=1, 2, 3, 4, 5, 6, 7 or 8, 2) the converter particles are distributed in the inorganic-organic hybrid material and 3) the converter particles convert the electromagnetic primary radiation at least partially into electromagnetic secondary radiation.

We also provide the optoelectronic device, wherein the converter carrier layer has a thermal conductivity of 0.2 W/mK to 10.0 W/mK.

We further provide the optoelectronic device, wherein M and M' are selected from the group consisting of B, Al, Si, Ti, Zr and Zn.

We further provide the optoelectronic device, wherein the reactive group suitable for crosslinking is selected from the group consisting of fluorine, chlorine, bromine, iodine, amino, amide, aldehyde, keto, carboxy, thiol, hydroxyl, acryloxy, methacryloxy, epoxy, isocyanate, ester, sulfonic acid, phosphoric acid and vinyl substituents.

We further provide the optoelectronic device, wherein the converter particles are bonded by chemical bonds to the inorganic-organic hybrid material.

We further provide the optoelectronic device, wherein the converter carrier layer is free of pores and cracks.

We further provide the optoelectronic device, wherein the converter particles have a particle diameter of 1 to 50 μm.

We further provide the optoelectronic device, wherein the converter carrier layer is formed as a casting compound and/or as a platelet, provided above the layer sequence.

We further provide the optoelectronic device, wherein the converter carrier layer is formed as a casting compound and/or as a platelet, provided above the layer sequence, and wherein an adhesive layer is arranged between the layer sequence and the platelet.

We further provide a method of producing an optoelectronic device including a converter carrier layer having a thermal conductivity of 0.2 W/mK to 10.0 W/mK, and the converter carrier layer is a casting compound, the method including A) forming a housing having a recess, B) introducing a layer sequence having an active layer, which emits electromagnetic primary radiation, into the recess of the housing, C) mixing converter particles, and Ca) at least one compound of Formulae I' or I" and at least one compound of Formula II:

where M and M' are the same or different and can represent a central atom with the charge m or m', where R and R' are the same or different and represent hydrogen and/or an organic residue, where Y represents an organic residue having a reactive group suitable for crosslinking, where x=m and where 0<n<m', 1<x'<m' and x'+n=m', where a=2, 3, 4, 5, 6, 7 or 8, where b and b' are the same or different and b, b'=1, 2, 3, 4, 5, 6, 7 or 8 and/or Cb) salts and esters of Si(OH)$_4$ and at least one compound selected from the group consisting of Al$_2$O$_3$, Bi$_2$O$_3$, P$_2$O$_3$, Sc$_2$O$_3$ and Y$_2$O$_3$, D) introducing the mixture into the recess, E) hydrolyzing and condensing the compounds stated in Ca) and/or Cb), F) crosslinking the compounds produced in E).

We further provide a method of producing an optoelectronic device including a converter carrier layer having a thermal conductivity of 0.2 W/mK to 10.0 W/mK, and the converter carrier layer is a platelet, the method including A) forming a housing having a recess, B) introducing a layer sequence having an active layer which emits electromagnetic primary radiation, into the recess of the housing, C') producing a plate including C) mixing converter particles and Ca) at least one compound of Formulae I' or I" and at least one compound of Formula II:

where M and M' are the same or different and can represent a central atom with the charge m or m', where R and R' are the same or different and represent hydrogen and/or an organic residue, where Y represents an organic residue having a reactive group suitable for crosslinking, where x=m and where $0<n<m'$, $1<x'<m'$ and $x'+n=m'$, where a=2, 3, 4, 5, 6, 7 or 8, where b and b' are the same or different and b, b'=1, 2, 3, 4, 5, 6, 7 or 8 and/or Cb) salts and esters of $Si(OH)_4$ and at least one compound selected from the group consisting of $Al_2O_3$, $Bi_2O_3$, $P_2O_3$, $Sc_2O_3$ and $Y_2O_3$, D') introducing the mixture into a two-dimensional mold, E) hydrolyzing and condensing the compounds stated in Ca) and/or Cb), F) crosslinking the compounds produced in E), G) separating the plate to form a plurality of platelets, and H) applying the platelet above the layer sequence.

We further provide the method of producing an optoelectronic device including a converter carrier layer having a thermal conductivity of 0.2 W/mK to 10.0 W/mK, and the converter carrier layer is a platelet, the method including A) forming a housing having a recess, B) introducing a layer sequence having an active layer which emits electromagnetic primary radiation, into the recess of the housing, C') producing a plate including C) mixing converter particles and Ca) at least one compound of Formulae I' or I" and at least one compound of Formula II:

where M and M' are the same or different and can represent a central atom with the charge m or m', where R and R' are the same or different and represent hydrogen and/or an organic residue, where Y represents an organic residue having a reactive group suitable for crosslinking, where x=m and where $0<n<m'$, $1<x'<m'$ and $x'+n=m'$, where a=2, 3, 4, 5, 6, 7 or 8, where b and b' are the same or different and b, b'=1, 2, 3, 4, 5, 6, 7 or 8 and/or Cb) salts and esters of $Si(OH)_4$ and at least one compound selected from the group consisting of $Al_2O_3$, $Bi_2O_3$, $P_2O_3$, $Sc_2O_3$ and $Y_2O_3$, D') introducing the mixture into a two-dimensional mold, E) hydrolyzing and condensing the compounds stated in Ca) and/or Cb), F) crosslinking the compounds produced in E), G) separating the plate to form a plurality of platelets, and H) applying the platelet above the layer sequence, and wherein method step E) takes place at a temperature of 20° C. to 150° C.

DETAILED DESCRIPTION

Our optoelectronic device comprises a layer sequence having an active layer which emits electromagnetic primary radiation, and at least one converter carrier layer arranged in the beam path of the electromagnetic primary radiation. The at least one converter carrier layer comprises converter particles and an inorganic-organic hybrid material and/or a silicate glass, wherein the converter particles are distributed in the inorganic-organic hybrid material and/or the silicate glass. The converter particles convert the electromagnetic primary radiation at least partially into electromagnetic secondary radiation.

With a converter carrier layer comprising converter particles and an inorganic-organic hybrid material and/or a silicate glass, heat produced by the converter particles can, surprisingly, be dissipated very effectively in the converter carrier layer. As a result, only a small or negligible heat build-up is produced in the converter carrier layer and a constant luminosity and a constant chromaticity coordinate can be guaranteed over the period of operation of the optoelectronic device. Therefore, premature failure of the optoelectronic device can be prevented and the service life of the optoelectronic device can be prolonged.

The fact that the converter particles convert the electromagnetic primary radiation at least partially into electromagnetic secondary radiation can mean on the one hand that the electromagnetic primary radiation is absorbed at least partially by the converter particles and emitted as secondary radiation having a wavelength range at least partially different from the primary radiation. A portion of the absorbed primary radiation is given off as heat by the converter particles. The electromagnetic primary radiation and electromagnetic secondary radiation can comprise one or a plurality of wavelengths and/or wavelength ranges in an infrared to ultraviolet wavelength range, in particular in a visible wavelength range. The spectrum of the primary radiation and/or the spectrum of the secondary radiation can be narrowband, that is to say that the primary radiation and/or the secondary radiation can comprise a single-colored or almost single-colored wavelength range. Alternatively, the spectrum of the primary radiation and/or the spectrum of the secondary radiation can also be broadband, that is to say that the primary radiation and/or the secondary radiation can comprise a mixed-colored wavelength range, wherein the mixed-colored wavelength range can comprise a continuous spectrum or a plurality of discrete spectral components having different wavelengths. For example, the electromagnetic primary radiation can comprise a wavelength range from an ultraviolet to green wavelength range, whereas the electromagnetic secondary radiation can comprise a wavelength range from a blue to infrared wavelength range. Particularly preferably, the primary radiation and the secondary radiation can be superposed to give the impression of white-colored light. For this purpose, the primary radiation can preferably give the impression of blue-colored light and the secondary radiation can give the impression of yellow-colored light which can be produced by spectral components of the secondary radiation in the yellow wavelength range and/or spectral components in the green and red wavelength range.

The fact that the converter particles convert the electromagnetic primary radiation at least partially into electromagnetic secondary radiation can also mean that the electromagnetic primary radiation is absorbed almost completely by the converter particles and is given off in the form of electromagnetic secondary radiation and in the form of heat. The emitted radiation of the optoelectronic device may thus correspond almost completely to the electromagnetic secondary radiation. The phrase "almost complete conversion" is to be understood to mean a conversion above 90%, in particular above 95%.

In this context, the term "layer sequence" means a layer sequence comprising more than one layer, e.g., a sequence of a p-doped semiconductor layer and an n-doped semiconductor layer, wherein the layers are arranged one on top of the other.

The layer sequence can be formed as an epitaxial layer sequence or as a radiation-emitting semiconductor chip having an epitaxial layer sequence, i.e., as an epitaxially grown semiconductor layer sequence. The layer sequence can be formed, e.g., on the basis of InGaAlN. InGaAlN-based semiconductor chips and semiconductor layer sequences are, in particular, those in which the epitaxially produced semiconductor layer sequence comprises a layer sequence consisting of different individual layers which contains at least one individual layer comprising a material from the III-V compound semiconductor material system InxAlyGa1-x-yN where $0 \leq x \leq 1$, $0 \leq y \leq 1$ and $x+y \leq 1$. Semiconductor layer sequences comprising at least one active layer on the basis of InGaAlN can emit, e.g., electromagnetic radiation in an ultraviolet to green wavelength range.

Alternatively or in addition, the semiconductor layer sequence or the semiconductor chip can also be based upon InGaAlP, that is to say that the semiconductor layer sequence can comprise different individual layers, of which at least one individual layer comprises a material from the III-V compound semiconductor material system InxAlyGa1-x-yP where $0 \leq x \leq 1$, $0 \leq y \leq 1$ and $x+y \leq 1$. Semiconductor layer sequences or semiconductor chips which comprise at least one active layer on the basis of InGaAlP can emit, e.g., preferably electromagnetic radiation having one or a plurality of spectral components in a green to red wavelength range.

Alternatively or in addition, the semiconductor layer sequence or the semiconductor chip can also comprise other III-V compound semiconductor material systems, e.g., an AlGaAs-based material or II-VI compound semiconductor material systems. In particular, an active layer comprising an AlGaAs-based material can emit electromagnetic radiation having one or a plurality of spectral components in a red to infrared wavelength range.

The active semiconductor layer sequence can comprise, in addition to the active layer, further functional layers and functional regions, for instance p-doped or n-doped charge carrier transport layers, i.e., electron or hole transport layers, undoped or p-doped or n-doped confinement, cladding or waveguide layers, barrier layers, planarisation layers, buffer layers, protective layers and/or electrodes and combinations thereof. Furthermore, one or a plurality of mirror layers can be applied, e.g., on a side of the semiconductor layer sequence facing away from the growth substrate. The structures described in this case, relating to the active layer or the further functional layers and regions are known, in particular with regard to construction, function and structure, and therefore will not be explained in greater detail at this juncture.

It is also possible for the converter carrier layer to consist of converter particles and an inorganic-organic hybrid material and/or a silicate glass.

The converter carrier layer may have a thermal conductivity of 0.2 W/mK to 10.0 W/mK. Preferably, the thermal conductivity of the converter carrier layer is 1.5 W/mK to 5.0 W/mK, particularly preferably the thermal conductivity of the converter carrier layer is 2.0 W/mK to 3.0 W/mK. In these ranges, the heat produced by the converter particles can be dissipated in a particularly effective manner in the converter carrier layer. The greater the thermal conductivity of the converter carrier layer, the better the heat dissipation.

The optoelectronic device can be luminescence diodes, photodiode-transistor arrays/modules and optical couplers. Alternatively, it is possible to select an organic light-emitting diode (OLED) as the optoelectronic device. In particular, the optoelectronic device can be an LED with an efficiency of up to 150 lm/W.

The inorganic-organic hybrid material may be produced by hydrolysis, mutual condensation and crosslinking at least of a compound of Formulae I, I' or I" and at least of a compound of Formula II:

where M and M' can be selected to be the same or different and in each case represent a central atom with the charge m or m'. R and R' can be selected to be the same or different and represent hydrogen and/or an organic residue. Y represents an organic residue with a reactive group suitable for crosslinking. The following also applies: $x=m$ and $0<n<m'$, $1<x'<m'$ and $x'+n=m'$. $a=1, 2, 3, 4, 5, 6, 7$ or $8$, preferably $a=3, 4, 5$ or $6$, particularly preferably $a=5$. $b$ and $b'$ can be selected to be the same or different and $b, b'=1, 2, 3, 4, 5, 6, 7$ or $8$.

We found that a converter carrier layer comprising this inorganic-organic hybrid material does not become yellow or cloudy or becomes only slightly so and does not change or scarcely changes in terms of its mechanical properties by reason of temperature and moisture loads to which the converter carrier layer can be subjected in an optoelectronic device, and primarily by reason of the beam load to which the converter carrier layer is subjected in an optoelectronic device. This also ensures that the light yield is not reduced or is reduced to a lesser extent and the emission characteristic of the optoelectronic device is not changed or is only changed slightly. The mechanical strength of the converter carrier layer can be at least substantially retained in spite of these loads.

By hydrolysis, the OR-groups on the central atom M and the OR'-groups on the central atom M' are replaced at least partially by OH-groups. Two OH-groups can form M-O-M-, M'-O-M'- and M-O-M'-bonds by a condensation reaction with splitting of H2O. It is also possible for an OH-group and an M-OR or M'-OR'-group to form M-O-M-, M'-O-M'- and M-O-M'-bonds by a condensation reaction with splitting of ROH or R'OH. If a compound of Formulae I' or I'' is used, the OR'-groups on the central atom M' are at least partially replaced by OH-groups by the hydrolysis. Two OH-groups can form M'-O-M'-, C—O-M', C—O—C-bonds by a condensation reaction with splitting of H2O. The respective C-atoms of the bonds C—O-M' and C—O—C originate from the diol or the triol of Formulae I' or I''. It is also possible for an OH-group and an M'-OR'-group to form an M'-O-M'-bond by a condensation reaction with splitting of R'OH.

With the Y-group(s) on the central atom M', the compounds of Formula II, hydrolyzed compounds of Formula II and/or the products of the compounds produced by condensation of compounds of Formulae I, I' or I'' and II can additionally crosslink. For example, a three-dimensional network of the inorganic-organic hybrid material is produced. By virtue of the additional crosslinking of the reactive groups suitable for crosslinking, the inorganic-organic hybrid material has a high chemical resistance, e.g., to water. The condensation of the hydrolyzed compounds of Formula I or the compounds of Formulae I' or I'' and Formula II is a reversible reaction. The condensed compounds could then be hydrolyzed by the effect of water. The three-dimensional network produced by the additional crosslinking prevents small amounts of water from being able to attack the chemical bonds of the inorganic-organic hybrid material.

Preferably, M and M' are selected to be different. A converter carrier layer comprising an inorganic-organic hybrid material, in which M and M' are selected to be different, demonstrates an even smaller yellowing or clouding tendency.

M and M' may be selected from a group comprising B, Al, Si, Ti, Zr, Zn. Preferably, M and M' represent Al, Si, Ti, Zi and Zn. Particularly preferably, M' represents Si. Particularly preferably, M represents Al.

The reactive group suitable for crosslinking may be selected from a group comprising fluorine, chlorine, bromine, iodine, amino, amide, aldehyde, keto, carboxy, thiol, hydroxy, acryloxy, methacryloxy, epoxy, isocyanate, ester, sulfonic acid, phosphoric acid and vinyl substituents. Preferably, the reactive group suitable for crosslinking is selected from a group comprising amino, thiol, hydroxy, epoxy, isocyanate and vinyl substituents. Particularly preferably, the reactive group suitable for crosslinking is selected from a group comprising amino, isocyanate and epoxy groups.

R and R' can be selected, e.g., from a group comprising hydrogen, alkyl substituents and aryl substituents. R and R' can be the same or different in a compound. Preferably, the organic residues R and R' are C1- to C8-alkyl residues which can be branched or unbranched. Excessively large or voluminous residues could shield the central atoms M and M' too greatly, which would impede or even prevent hydrolysis or condensation of the molecules. Particularly preferably, R and R' can be selected from a group comprising methyl, ethyl, propyl, isopropyl, butyl, isobutyl, sec-butyl, tert-butyl, cyclohexyl, phenyl residues and combinations thereof.

The inorganic-organic hybrid material may be produced from 5 to 50 mol %, preferably 10 to 30 mol %, particularly preferably 10 to 20 mol % at least of a compound of Formula I, a compound of Formula I' or a compound of Formula I''. With a variation of the mole percentage of the compound of Formula I, the compound of Formula I' or the compound of Formula I'' relative to the total amount from Formulae I, I' or I'' and II, the refractive index of the converter carrier layer can be varied and therefore controlled. The coupling-out of light can be increased if the refractive index of the converter carrier layer has a similar refractive index to the layers adjoining the converter carrier layer.

The inorganic-organic hybrid material may be produced from 50 to 95 mol %, preferably 70 to 90 mol %, particularly preferably 70 to 80 mol % at least of a compound of Formula II relative to the total amount from Formulae I, I' or I'' and II. The elasticity of the inorganic-organic hybrid material can be adjusted by the proportion of compounds of Formula II relative to the total amount from Formulae I, I' or I'' and II. As a result of the hydrolysis and condensation exclusively of compounds of Formula I, the polymer produced would be very brittle. The elasticity is significant for the production of the converter carrier layer. Shrinkage occurs during hardening of the converter carrier layer by condensation and crosslinking. In the case of brittle materials and materials which are not very elastic, this shrinkage can produce undesired cracks in the converter carrier layer.

The inorganic-organic hybrid material may be produced by hydrolysis, mutual condensation and crosslinking of a compound of Formulae I, I' or I'' and two compounds of Formula II. With such a combination, elasticity can be adjusted in a particularly effective manner. An inorganic-organic hybrid material produced in this manner also has a thermal conductivity which is improved once again.

It is preferred that the reactive group of the first compound of Formula II suitable for crosslinking can crosslink with the reactive group of the second compound of Formula II suitable for crosslinking. For example, the reactive group of the first compound of Formula II suitable for crosslinking can be an amino substituent and the reactive group of the second compound of Formula II suitable for crosslinking can be an epoxy substituent. It is also possible for the reactive group of the first compound of Formula II suitable for crosslinking to be a thiol substituent and for the reactive group of the second compound of Formula II suitable for crosslinking to be a vinyl substituent. However, other combinations are also feasible.

The first and the second compound of Formula II may comprise the same number n of Y-groups.

Preferably, the two compounds of Formula II are used in a ratio of 1:1 with respect to one another. Therefore, all or almost all of the reactive groups of the first compound of Formula II suitable for cross-linking can crosslink with the reactive groups of the second compound of Formula II suitable for crosslinking Ideally, after condensation or crosslinking there are no or almost no reactive groups suitable for crosslinking present any longer in the inorganic-organic hybrid material. An inorganic-organic hybrid material produced in this manner is still less susceptible to yellowing as only very few reactive organic groups are present which react easily and therefore have a greater tendency towards yellowing.

The compound of Formula II may be a compound of the following Formula II':

Formula II' where n"=1, 2, 3, 4, 5 or 6, preferably n"=2, 3 or 4.

Through the use of such compounds, an inorganic-organic hybrid material is obtained which is scarcely susceptible to yellowing by reason of UV-radiation and/or light in the visible range of the electromagnetic spectrum.

For example, it is 3-isocyanatopropyltriethoxysilane:

The inorganic-organic hybrid material may be produced by hydrolysis, mutual condensation and crosslinking at least of a compound of Formula I' or Formula I" and a compound of Formula II'.

The ratio of isocyanate groups of the compounds of Formula II' to the ratio of the OH-groups of the diol of Formula I' or of the triol of Formula I" is 1 to 0.5. Depending upon the desired strength of the hybrid material, triols are used for a high desired strength and diols are used for a slightly lower strength of the inorganic-organic hybrid material. By crosslinking, in this case the reaction of OH-groups with the isocyanate groups, a stable urethane group is formed which also remains stable because of the effects of electromagnetic radiation. An inorganic-organic hybrid material is obtained which is only very slightly susceptible to yellowing by reason of the effect of UV-radiation and/or light in the visible range of the electromagnetic spectrum.

The silicate glass may be produced by hydrolysis and mutual condensation from SiO2 and/or salts and esters of Si(OH)4 and at least one compound selected from a group comprising $Al_2O_3$, $Bi_2O_3$, $P_2O_3$, $Sc_2O_3$ and $Y_2O_3$.

Preferably, the silicate glass is produced by hydrolysis and mutual condensation from $y(Na_2O).x(SiO_2).H_2O$, $SiO_2$ and at least one compound selected from a group comprising $Al_2O_3$, $Bi_2O_3$, $P_2O_3$, $Sc_2O_3$ and $Y_2O_3$.

The ratio y:x in the formula $y(Na_2O).x(SiO_2).H_2O$ is 1:1 to 4:1, preferably 2:1 to 3.8:1. Particularly preferably, the silicate glass is produced by hydrolysis and mutual condensation from $y(Na_2O).x(SiO_2).H_2O$, $SiO_2$ and $Al_2O_3$. The ratio y:x in the formula $y(Na_2O).x(SiO_2).H_2O$ is 1:1 to 4:1, preferably 2:1 to 3.8:1.

The silicate glass may be selected from a group comprising borosilicate glass, aluminosilicate glass, phosphosilicate glass, scandium silicate glass and yttrium silicate glass.

We found that a converter carrier layer comprising such silicate glasses does not become yellow or cloudy or becomes only slightly so and does not change or scarcely changes in terms of its mechanical properties by reason of temperature and moisture loads to which the converter carrier layer can be subjected in an optoelectronic device, and primarily by reason of the beam load to which it is subjected in an optoelectronic device. Compared to the inorganic-organic hybrid material, it demonstrates an even lower tendency towards yellowing, since the silicate glasses do not contain any organic groups which tend to be less stable than purely inorganic materials such as, e.g., the silicate glasses. This also ensures that the light yield is not reduced or reduced to a lesser extent and the emission characteristic of the optoelectronic device is not changed or only very slightly changed. The mechanical strength of the converter carrier layer can also be at least substantially retained in spite of these loads.

Preferably, the silicate glass comprises an aluminosilicate glass or a phosphosilicate glass. Particularly preferably, the silicate glass is an aluminosilicate glass.

The converter particles may be bonded by chemical bonds to the inorganic-organic hybrid material and/or the silicate glass. "Chemical bonds" mean covalent bonds, ion bonds or even coordinative bonds. By reason of the chemical bonding of the converter particles, pores and cracks in the converter carrier layer can be avoided or greatly reduced. Pore-free or crack-free converter carrier layers ensure, over the entire converter carrier layer, constant and efficient heat dissipation and a constant and efficient emission characteristic of the electromagnetic primary and/or secondary radiation. If the converter carrier layer comprises converter particles and a silicate glass, a fixed ceramic network is produced by the chemical bonds.

The converter carrier layer may be free of pores and cracks.

The converter particles may have a particle diameter of 1 to 50 μm. Preferably, the converter particles have a particle diameter of 5 to 15 μm, particularly preferably of 10 μm. In particular, with a particle size of 10 μm the thermal conductivity of the converter carrier layer is particularly high, which significantly prolongs the service life of the optoelectronic device.

The converter particles can be formed, e.g., from one of the following luminescent substances: garnets doped with rare earth metals, alkaline earth sulfides doped with rare earth metals, thiogallates doped with rare earth metals, aluminates doped with rare earth metals, silicates doped with rare earth metals such as orthosilicates, chlorosilicates doped with rare earth metals, alkaline earth silicon nitrides doped with rare earth metals, oxynitrides doped with rare earth metals and aluminium oxynitrides doped with rare earth metals, silicon nitrides doped with rare earth metals, sialons.

The luminescent substances which can be used are in particular garnets such as yttrium aluminium oxide (YAG), lutetium aluminium oxide (LuAG) and terbium aluminium oxide (TAG).

The luminescent substances are doped, e.g., with one of the following activators: cerium, europium, terbium, praseodymium, samarium, manganese.

The converter carrier layer may comprise converter particles of different luminescent substances.

The converter carrier layer may be transparent for the primary radiation emitted by the active layer of the layer sequence. "Transparent" means that a material, a layer or an element is at least partially permeable for the entire visible electromagnetic spectrum or a partial spectrum thereof. The radiation emitted by the layer sequence can be, e.g., in the visible range of the electromagnetic spectrum.

The converter carrier layer may be transparent for the secondary radiation emitted by the converter particles.

Preferably, the converter carrier layer has a transparency above 95%, particularly preferably the transparency of the converter carrier layer is above 98% for the emitted primary radiation and/or for the emitted secondary radiation.

It is also possible that the optoelectronic device comprises a housing. A recess can be present in the center of the housing. The layer sequence can be provided in the recess. It is also possible that the recess is filled with a casting compound.

The converter carrier layer may be formed as a casting compound. The casting compound can fill the recess in the housing. It is possible that the casting compound contacts the surrounding area. If the converter carrier layer is a casting compound in contact with the surrounding area, the diffusion rate of $H_2O$ and gases from the surrounding area are very low by reason of the dense network of the converter carrier layer. Particularly, compared to converter carrier layers comprising silicone, the diffusion rate of $H_2O$ and gases from the surrounding area is significantly reduced.

The converter carrier layer may be formed as a platelet arranged above the layer sequence. The platelet can be provided directly on the layer sequence. It is possible that the platelet covers the entire surface of the layer sequence. If the converter carrier layer is formed as a platelet, it is possible that the layer thickness of the entire platelet is uniform. In this way, a constant chromaticity coordinate can be achieved over the entire surface of the platelet.

The converter carrier layer may be a lens. It is possible that the lens is arranged above a casting compound.

The optoelectronic device may comprise two converter carrier layers. In this way, the quantity of converter particles in the optoelectronic device can be increased without the volume proportion of the converter particles in one converter carrier layer having to be selected too high, e.g., above 50 percent by volume. In this way, the light conversion can be configured more efficiently.

In this case, the first converter carrier layer can be a casting compound comprising converter particles and an inorganic-organic hybrid material and/or a silicate glass, wherein the converter particles are distributed in the inorganic-organic hybrid material and/or the silicate glass. The second converter carrier layer can be a platelet, provided above the layer sequence, comprising converter particles and an inorganic-organic hybrid material and/or a silicate glass, wherein the converter particles are distributed in the inorganic-organic hybrid material and/or the silicate glass.

It is also possible that the second converter carrier layer is a lens, comprising converter particles and an inorganic-organic hybrid material and/or a silicate glass, wherein the converter particles are distributed in the inorganic-organic hybrid material and/or the silicate glass.

It is also possible that the first converter carrier layer is a platelet, provided above the layer sequence, comprising converter particles and an inorganic-organic hybrid material and/or a silicate glass, wherein the converter particles are distributed in the inorganic-organic hybrid material and/or the silicate glass. The second converter carrier layer can be a lens, comprising converter particles and an inorganic-organic hybrid material and/or a silicate glass, wherein the converter particles are distributed in the inorganic-organic hybrid material and/or the silicate glass.

The first and the second converter carrier layer can comprise the same converter particles and the same inorganic-organic hybrid material and/or the same silicate glass.

Preferably, the first and the second converter carrier layer comprise different converter particles and different inorganic-organic hybrid materials and/or different silicate glasses.

It is also possible that the first and the second converter carrier layer comprise the same converter particles and different inorganic-organic hybrid materials and/or different silicate glasses.

It is also possible that the first and the second converter carrier layer comprise different converter particles and the same inorganic-organic hybrid material and/or the same silicate glass.

The optoelectronic device may comprise at least one second layer sequence.

The first, the second and each further layer sequence may be arranged next to one another.

It is possible that converter carrier layers in the form of a platelet are applied above the second and each further layer sequence.

It is also possible that a platelet is applied above the first, the second and each further layer sequence. In this way, the production process of the optoelectronic device is controlled, as a platelet does not have to be produced and applied for each layer sequence.

The platelet may have a thickness of 1 µm to 1000 µm, preferably 10 µm to 500 µm, particularly preferably 10 µm to 70 µm. On the one hand, with a thickness of 10 µm to 70 µm, efficient heat dissipation can be effected and on the other hand the dimensions of the optoelectronic device can be minimized.

It is possible that a casting compound is arranged above the platelet. The casting compound can be selected from conventional casting materials.

The fact that a layer or an element is arranged or applied "on" or "above" another layer or another element can mean here and hereinafter that one layer or one element is directly arranged in direct mechanical and/or electrical contact on the other layer or the other element. Furthermore, it can also mean that one layer or one element is indirectly arranged on or above the other layer or the other element. Then, further layers and/or elements can be arranged between one layer or the other layer or between one element or the other element.

An adhesive layer may be arranged between the layer sequence and the platelet.

It is possible that an adhesive layer is arranged between the casting compound and the lens.

The fact that a layer or an element is arranged between two other layers or elements can mean here and hereinafter that one layer or one element is directly arranged in direct mechanical and/or electrical contact or in indirect contact with one of the two other layers or elements and in direct mechanical and/or electrical contact or electrical or in indirect contact with others of the two other layers or elements. In the case of indirect contact, further layers and/or elements can then be arranged between one layer and at least one of the two other layers or between one element and at least one of the two other elements.

It is possible that the adhesive layer consists of silicone or comprises silicone. Silicone can provide effective adhesion of the layer sequence and the platelet. The effective adhesion of the layer sequence and the platelet prevents premature delamination of the platelet from the layer sequence and therefore the service life of the optoelectronic device can be prolonged.

Silicone can also provide effective adhesion of the casting compound and the lens. The effective adhesion of the casting compound and the lens prevents premature delamination of the lens from the casting compound and therefore the service life of the optoelectronic device can be prolonged.

The adhesive layer can be applied over the entire surface, in a structured fashion or at selected points between the layer sequence and the platelet.

The adhesive layer can be applied over the entire surface, in a structured fashion or at selected points between the casting compound and the lens.

The adhesive layer can have a layer thickness of 1 µm to 50 µm, preferably 1 µm to 30 µm, particularly preferably 1 µm to 20 µm.

The converter particles may be present from 1 to 50 percent by volume in relation to the inorganic-organic hybrid material and/or the silicate glass. 10 to 40 percent by volume is preferred, 20 to 30 percent by volume is particularly preferred.

The converter particles may be distributed homogeneously or with concentration gradients in the inorganic-organic hybrid material and/or the silicate glass.

The described optoelectronic devices can be produced in accordance with methods stated hereinafter.

Methods of producing an optoelectronic device comprising a converter carrier layer is also provided. The converter carrier layer has a thermal conductivity of 0.2 W/mK to 10.0 W/mK.

The converter carrier layer may be a casting compound. The production method comprises the following method steps:

A) forming a housing having a recess,
B) introducing a layer sequence having an active layer, which emits electromagnetic primary radiation, into the recess of the housing,
C) mixing converter particles, and
Ca) at least one compound of Formulae I, I' or I'' and at least one compound of Formula II:

where M and M' can be selected to be the same or different and in each case represent a central atom with the charge m or m',
where R and R' can be selected to be the same or different and represent hydrogen and/or an organic residue,
wherein Y represents an organic residue with a reactive group suitable for crosslinking, where x=m and
where 0<n≤m', 1<x'<m' und x'+n=m',
where a=1, 2, 3, 4, 5, 6, 7 or 8, preferably a=3, 4, 5 or 6, particularly preferably a=5,
where b and b' can be selected to be the same or different and b, b'=1, 2, 3, 4, 5, 6, 7 or 8 and/or
Cb) $SiO_2$ and/or salts and esters of $Si(OH)_4$ and at least one compound selected from a group comprising $Al_2O_3$, $Bi_2O_3$, $P_2O_3$, $Sc_2O_3$ and $Y_2O_3$,
D) introducing the mixture into the recess,
E) hydrolyzing and condensing the compounds stated in Ca) and/or Cb),
F) crosslinking the compounds produced in E).

Since it is possible to also produce silicate glasses by hydrolysis and condensation, they can now also be a component of casting compounds. Typical production of silicate glasses by sintering is not possible by reason of the very high temperatures which are required and which would damage the device.

The converter carrier layer may be a platelet. The production method comprises the following method steps:
A) forming a housing having a recess,
B) introducing a layer sequence having an active layer, which emits electromagnetic primary radiation, into the recess of the housing,
C') producing a plate comprising the method steps of:
C) mixing converter particles, and
Ca) at least one compound of Formulae I, I' or I'' and at least one compound of Formula II:

where M and M' can be selected to be the same or different and in each case represent a central atom with the charge m or m',
where R and R' can be selected to be the same or different and represent hydrogen and/or an organic residue,
where Y represents an organic residue with a reactive group suitable for crosslinking,
where x=m and
where 0<n≤m', 1<x'<m' and x'+n=m',
where a=1, 2, 3, 4, 5, 6, 7 or 8, preferably a=3, 4, 5 or 6, particularly preferably a=5,
where b and b' can be selected to be the same or different and b, b'=1, 2, 3, 4, 5, 6, 7 or 8 and/or
Cb) $SiO_2$ and/or salts and esters of $Si(OH)_4$ and at least one compound selected from a group comprising $Al_2O_3$, $Bi_2O_3$, $P_2O_3$, $Sc_2O_3$ and $Y_2O_3$,
D') introducing the mixture into a two-dimensional mold,
E) hydrolyzing and condensing the compounds stated in Ca) and/or Cb),
F) crosslinking the compounds produced in E),
G) separating the plate to form a plurality of platelets,
H) applying the platelet above the layer sequence.

Producing the platelets by separating them from a large plate means that the platelets can be produced cost-effectively and rapidly. For instance, e.g., 100 platelets can be produced from one plate which has an area of, e.g., 1 $cm^2$.

Instead of using compounds of Formula II in method step Ca), it is possible to use a compound of Formula II, in which Y is provided with a protective group. This prevents, in method step E) in parallel with hydrolyzing and condensing the compounds stated in Ca), the reactive group of the organic residue Y suitable for crosslinking from already reacting. Therefore, it is possible to ensure that the crosslinking does not already take place in method step E) but instead only takes place in method step F).

If for the compound of Formula II a compound is used in which Y represents an organic residue having a reactive isocyanate group suitable for crosslinking, the isocyanate group can initially be blocked with a protective group. Triazoles and imidazoles, e.g., 1,2,4-triazole, can be used as the protective group. Such a compound can have the following Formula II*:

Formula II* where n″=1, 2, 3, 4, 5, 6, preferably n″=2, 3, 4. Through the use of compounds of Formula II*, a storable sol is obtained by the hydrolysis and condensation in method step E). This storable sol is also retained when acid is added. For example, it is Compounds of Formula II* are obtained by reaction of isocyanates of Formula II and 1,2,4-trialzole, e.g., by reaction of 3-isocyanatopropyltriethoxysilane with 1,2,4-trialzole at a temperature of 125° for six hours.

An acid may be added in method step C). The required amount of acid can be determined in dependence upon the number of hydrolyzable OR— and OR'-groups of the compounds of Formula I and Formula II. The ratio of the number of acid protons of the acid to the number of hydrolyzable OR— and OR'-groups of the compounds of Formula I and Formula II is between 0.33 to 0.5.

Method step E) of the compounds stated in Ca) and/or Cb) may be performed at a pH value of 1 to 5. Particularly preferably, method step E) of the compounds stated in Ca) and/or Cb) is performed at a pH value of 1 to 3.

A method step "A1) producing the layer sequence" may take place between method step A) and method step B).

It is possible that the layer sequence is produced in method step A1) by "a1) providing a large-area layer sequence" and "a2) sawing or otherwise cutting the layer sequence, produced over a large area, into a plurality of smaller units having the same layer sequence but a smaller surface area."

If the converter carrier layer is a platelet, it is possible that method step C') comprising method steps C), Ca), Cb), D', E) and F) takes place prior to method step A1). After method step a1), a method step "H') applying the plate above the large-area layer sequence" could be performed. In accordance with this example, method steps G) and H) are no longer required. This renders it possible to perform methods steps a2) and G) in one step, to thus control the entire process of producing the optoelectronic device.

Since it is possible to also produce the platelets by hydrolysis and condensation, production of the plate does not require the complex and expensive sintering process.

It is also possible that, instead of using the compounds stated in Cb) it is possible to use already hydrolyzed and partially condensed compounds of $SiO_2$ and/or salts and esters of $Si(OH)_4$ and at least one compound, selected from a group comprising $Al_2O_3$, $Bi_2O_3$, $P_2O_3$, $Sc_2O_3$ and $Y_2O_3$. However, the condensation should only be continued to such an extent that the compound has not yet solidified. In step E), these compounds would then only be condensed. In this way, it is possible to reduce the shrinkage of the material during hardening, as less water is produced during the condensation. In the case of this method, thicker, crack-free converter carrier layers can be produced. It is possible to produce platelets having thicknesses of up to 1000 μm. In the case of casting compounds, thicknesses of up to 600 μm can be achieved.

It is also possible that instead of using the compounds stated in Cb), it is possible to use already hydrolyzed and partially condensed compounds of $y(Na_2O).x(SiO)_2.H_2O$, $SiO_2$ and at least one compound, selected from a group comprising $Al_2O_3$, $Bi_2O_3$, $P_2O_3$, $Sc_2O_3$ and $Y_2O_3$. The ratio y:x in the formula $y(Na_2O).x(SiO_2).H_2O$ is 1:1 to 4:1, preferably 2:1 to 3.8:1. In this case, the condensation should also only be continued to such an extent that the compound has not yet solidified.

In a similar manner, it is also possible to use already hydrolyzed and partially condensed compounds of Formulae I and II in method step Ca). In step E), these compounds would then only be condensed. In this case, it is also possible to produce platelets having thicknesses of up to 1000 μm and casting compounds having thicknesses of up to 600 μm without any cracks.

It is also possible that prior to method step H), a method step "H1) applying an adhesive layer onto the layer sequence" takes place. The adhesive layer can be applied over the entire surface, in a structured fashion or at selected points onto the layer sequence.

It is also possible that prior to method step H), a method step "H2) applying an adhesive layer onto the platelet" takes place. The adhesive layer can be applied over the entire surface, in a structured fashion or at selected points onto the platelet.

Separation of the plate to form a plurality of platelets may be performed in method step G) with a laser.

It is also possible, instead of method step C'), to perform the following method step:

"C*) producing a platelet comprising the method steps of
C) mixing converter particles and
Ca) at least one compound of Formulae I, I' or I″ and at least one compound of Formula II:

where M and M' can be selected to be the same or different and in each case represent a central atom with the charge m or m',
where R and R' can be selected to be the same or different and represent hydrogen and/or an organic residue,
where Y represents an organic residue having a reactive group suitable for crosslinking,
where x=m and
where 0<n<m', 1<x'<m' and x'+n=m',
where a=1, 2, 3, 4, 5, 6, 7 or 8, preferably a=3, 4, 5 or 6, particularly preferably a=5,
where b and b' can be selected to be the same or different and b, b'=1, 2, 3, 4, 5, 6, 7 or 8 and/or Cb) $SiO_2$ and/or salts and esters of $Si(OH)_4$ and at least one compound selected from a group comprising $Al_2O_3$, $Bi_2O_3$, $P_2O_3$, $Sc_2O_3$ and $Y_2O_3$, D') introducing the mixture into a two-dimensional mold, E) hydrolyzing and condensing the compounds stated in Ca) and/or Cb)."

Method step G) is thus not necessarily required.

After method step B) a method step "B1) introducing at least one second layer sequence having an active layer, which emits electromagnetic primary radiation, into the recess of the housing" may be performed.

If a method step B1) is performed, then instead of method step H), method step "H*) applying a first platelet above the first layer sequence and applying a second platelet above the second layer sequence" can take place.

It is also possible, instead of method step H), to perform the method step "H**) applying the platelet above the first layer sequence and above the second layer sequence."

Method step E) may take place at a temperature of 20° C. to 150° C. If the converter carrier layer is a casting compound, higher temperatures would damage the layer sequence.

Method step E) may include a sol-gel process. The sol obtained in this manner, can be stored. The sol can be stored for several weeks, in particular 1 to 10 weeks, e.g., 4 weeks. Therefore, a certain amount of time can lapse, e.g., between method step E) and method step F).

The condensation in method step E) produces $H_2O$, R'OH and/or ROH, in which the gel produced in each case in E) is dissolved.

In method step C) a solvent may be added. The solvent can be isopropanol, ethanol and/or 1-methoxy-2-propoanol.

The resulting $H_2O$, R'OH and/or ROH and/or the solvent may be removed in a method step F'). Method step F') can be performed after method step E) or after method step E) or F).

Crosslinking may be initiated in step F) thermally and/or by radiation.

Crosslinking may be initiated in step F) by IR radiation and/or UV radiation.

Crosslinking may be initiated in step F) at a maximum temperature of 150° C. If in method step Ca) a compound of Formula II* has been used, the protective group is split at a temperature of 150° C. so that the crosslinking can take place via the isocyanate group. The crosslinking can be performed by a reaction of OH-groups with the isocyanate groups, wherein a stable urethane group is formed which also remains stable by the effects of electromagnetic radiation.

It is possible that the crosslinking in method step F) already forms part of method step E). This is possible, e.g., if method step E) is performed at a temperature higher than room temperature.

Further advantages and developments will be apparent from the examples described hereinafter in conjunction with the figures.

In the examples and figures, like elements, or elements acting in an identical manner, are provided with the same reference numerals in each case. The illustrated elements and their size ratios with respect to each other are not to be regarded as being to scale. Rather, individual elements, in particular layer thicknesses, may be illustrated excessively large for greater ease of understanding.

Figure 1:
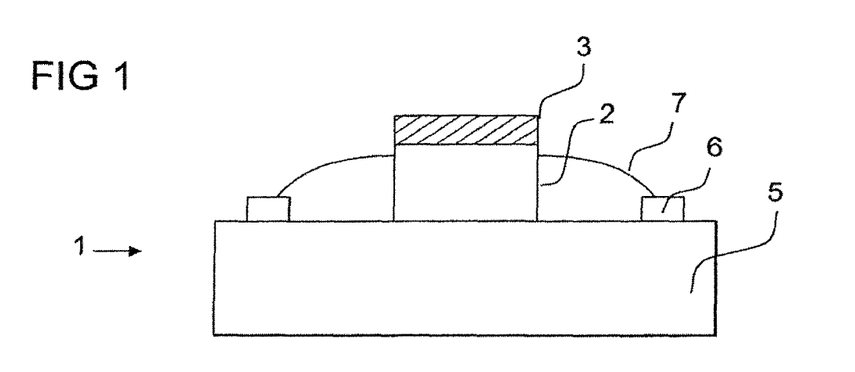
FIGS. 1 and 2 show schematic side views of different examples of optoelectronic devices.

The optoelectronic device 1 in accordance with FIG. 1 comprises a carrier 5 with a lead frame 6. Arranged on the carrier 5 is a layer sequence 2 electrically connected to the lead frame 6 via bond wires 7. Provided above the layer sequence 2 is a converter carrier layer in the form of a platelet 3. The converter carrier layer 3 comprises converter particles and an inorganic-organic hybrid material or converter particles and a silicate glass, wherein the converter particles are distributed, e.g., homogeneously in the inorganic-organic hybrid material or in the silicate glass. The platelet 3 is arranged in the beam path of the electromagnetic primary radiation emitted by an active layer (not illustrated here) in the layer sequence 2.

In addition, an adhesive layer (not illustrated here) can be provided between the layer sequence 2 and the converter carrier layer 3. The adhesive layer can comprise, e.g., silicone.

Preferably, the optoelectronic device 1 is an LED, wherein the radiation is coupled out upwardly via a transparent semiconductor layer sequence 2 and the converter carrier layer 3 which is formed in a transparent manner.

Figure 2:
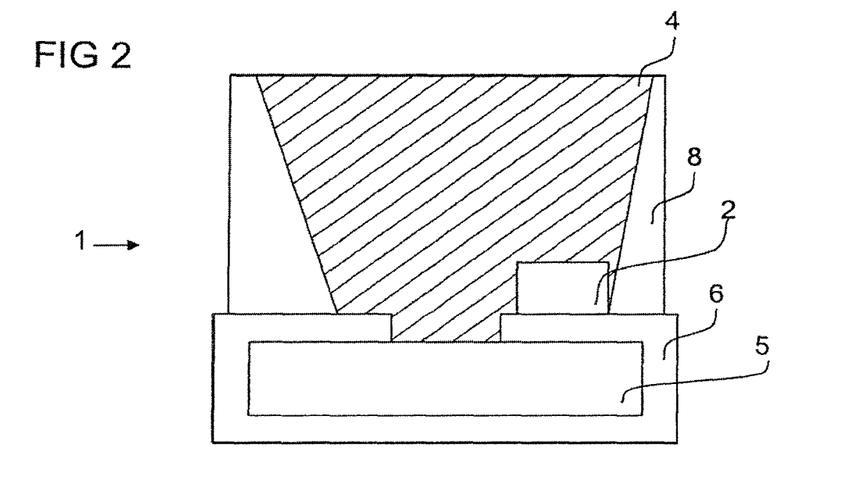

The optoelectronic device 1 in accordance with FIG. 2 comprises a carrier 5 with a lead frame 6 and a housing 8. The housing 8 comprises, in the center, a recess in which the layer sequence 2 is arranged which is electrically connected to the lead frame 6. The recess is filled with a casting compound 4. The casting compound 4 comprises converter particles and an inorganic-organic hybrid material or converter particles and a silicate glass, wherein the converter particles are distributed, e.g., homogeneously in the inorganic-organic hybrid material or in the silicate glass. The casting compound 4 is arranged in the beam path of the electromagnetic primary radiation emitted by an active layer (not illustrated here) in the layer sequence 2.

In addition, a further converter carrier layer in the form of a platelet 3 can be provided above the layer sequence. The platelet 3 comprises converter particles and an inorganic-organic hybrid material or converter particles and a silicate glass, wherein the converter particles are distributed, e.g., homogeneously in the inorganic-organic hybrid material or in the silicate glass.

Preferably, the optoelectronic device 1 is an LED, wherein the radiation is coupled out upwardly via a transparent semiconductor layer sequence 2 and a transparent casting compound 4.

Figure 3:
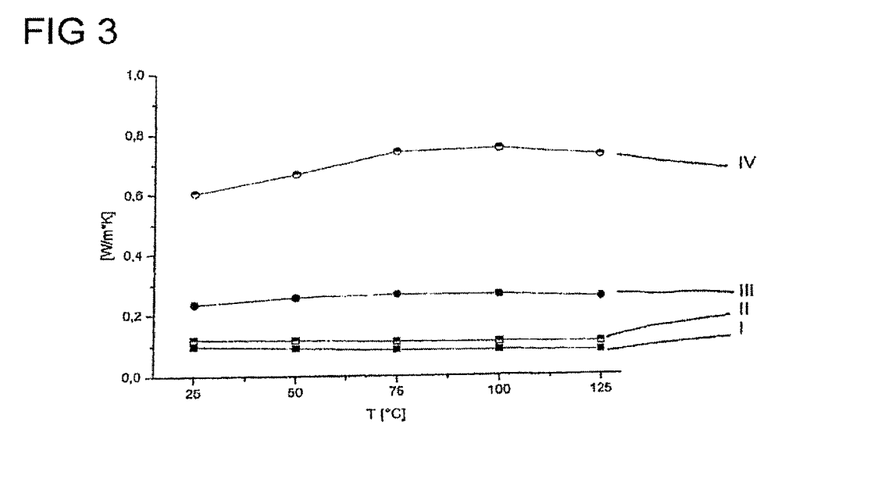
FIGS. 3 and 4 show the thermal conductivity of converter carrier layers.

FIG. 3 shows the thermal conductivities of converter carrier layers. The converter carrier layers have a thickness of 1.0 to 1.6 mm and an area of 10 mm×10 mm. The Y-axis plots thermal conductivity in W/mK and the x-axis plots temperature T in ° C.

The thermal conductivities provided with the reference numerals I to IV are allocated converter carrier layers, consisting of:

I: silicone;

II: silicone and 3 percent by volume converter particles having a diameter of 10 μm;

III: inorganic-organic hybrid material produced from a compound of Formula I where M=Al and a compound of Formula II where M'=Si;

IV: inorganic-organic hybrid material produced from a compound of Formula I where M=Al and a compound of Formula II where M'=Si and 3 percent by volume converter particles having a diameter of 10 μm.

It is evident that the converter carrier layers comprising the inorganic-organic hybrid material (III) have a thermal conductivity which is more than twice as high compared to converter carrier layers consisting of pure silicone (I). The thermal conductivity of the converter carrier layer comprising the inorganic-organic hybrid material (III) can be increased once again significantly (by more than 100%) by the admixture of converter particles (IV) and then has a thermal conductivity which is higher, by approximately a factor of 5, than the converter carrier layer consisting of pure silicone (I). However, the converter carrier layer consisting of silicone and converter particles (II) has in comparison with the converter carrier layer consisting of silicone (I) only a slight increase.

Figure 4:
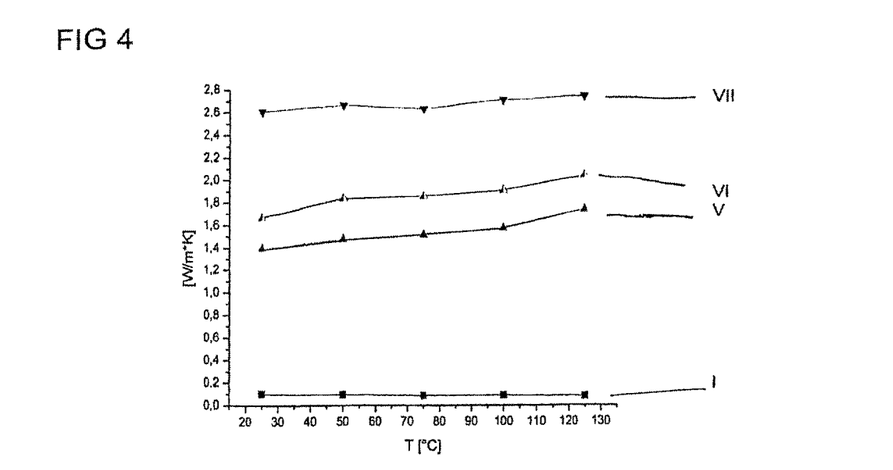

FIG. 4 shows the thermal conductivities of converter carrier layers. The converter carrier layers have a thickness of 1.0 to 1.6 mm and an area of 10 mm×10 mm. The y-axis plots thermal conductivity in W/mK and the x-axis plots temperature T in ° C. The thermal conductivities provided with the reference numerals I, V, VI and VII are allocated converter carrier layers, consisting of:

I: silicone;
V: aluminosilicate glass and 20 percent by volume converter particles having a diameter of 3 to 5 µm;
VI: aluminosilicate glass and 30 percent by volume converter particles having a diameter of 3 to 5 µm;
VII: aluminosilicate glass and 20 percent by volume converter particles having a diameter of 10 µm.

It is evident that the converter carrier layers consisting of aluminosilicate glass and 20 percent by volume converter particles having a diameter of 3 to 5 µm (V) have a thermal conductivity more than twelve times as high compared to converter carrier layers consisting of pure silicone (I). The thermal conductivity of the converter carrier layer can be increased once again by the admixture of 30 percent by volume converter particles having a diameter of 3 to 5 µm to the aluminosilicate glass (VI). The best thermal conductivity is achieved in the case of a converter carrier layer comprising aluminosilicate glass and 20 percent by volume converter particles having a diameter of 10 µm (VII). On the whole, by using converter carrier layers consisting of the aluminosilicate glass and converter particles it is possible to achieve a thermal conductivity up to more than 20 times higher in comparison with converter carrier layers consisting of silicone (I).

Figure 5A:
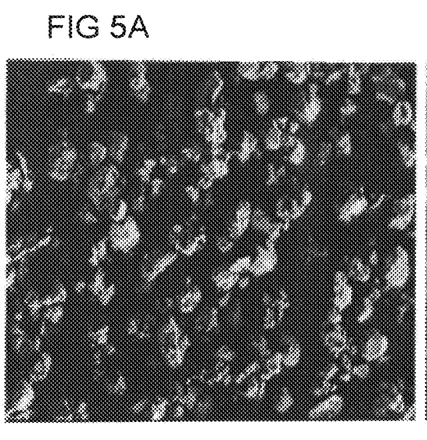
FIGS. 5A and 5B show scanning electron microscope images of converter particles.

FIG. 5a shows a scanning electron microscope image of converter particles 3 to 5 µm in size.

Figure 5B:
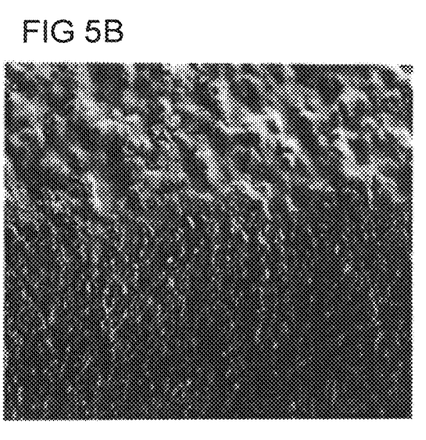

FIG. 5b shows a scanning electron microscope image of the converter particles of FIG. 5a in an aluminosilicate glass. As can be seen, the converter particles and the aluminosilicate glass form a pore-free and crack-free layer. The converter particles are chemically bonded to the aluminosilicate glass so that a solid ceramic network is produced.

Figure 6A:
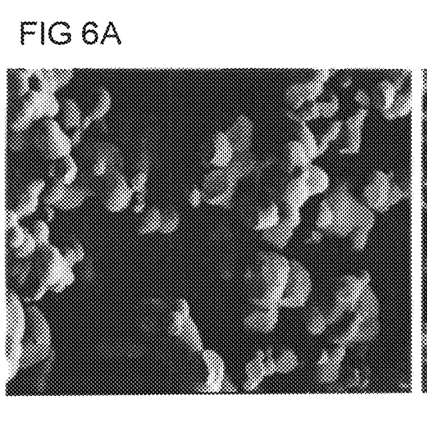
FIGS. 6A and 6B show scanning electron microscope images of converter carrier layers.

FIG. 6a shows a scanning electron microscope image of converter particles 5 to 10 µm in size.

Figure 6B:
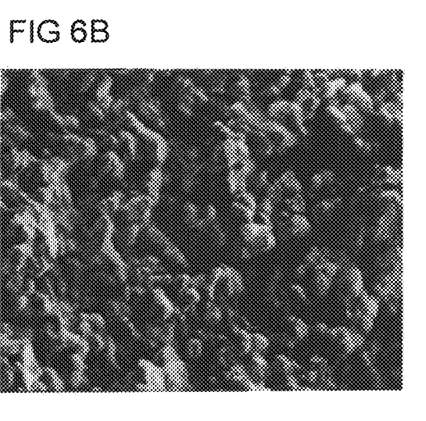

FIG. 6b shows a scanning electron microscope image of the converter particles of FIG. 6a in an aluminosilicate glass. As can be seen, the converter particles and the aluminosilicate glass form a pore-free and crack-free layer. The converter particles are chemically bonded to the aluminosilicate glass so that a solid ceramic network is produced.

Figure 7:
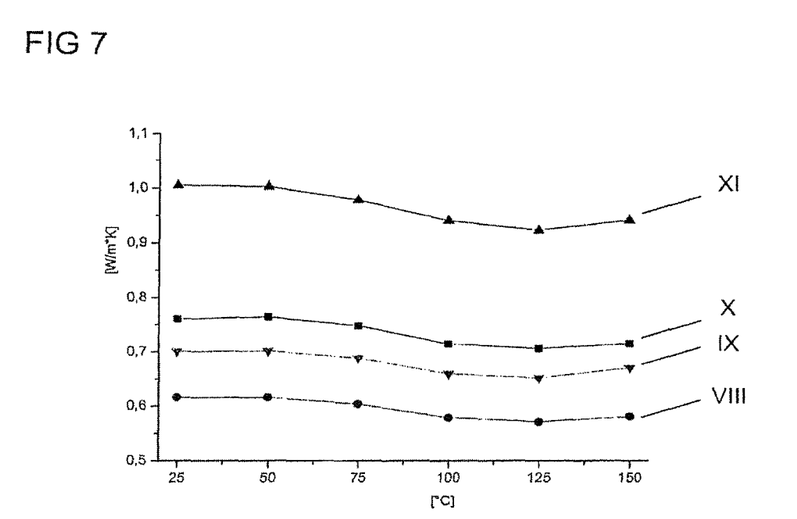
FIG. 7 shows the thermal conductivity of converter carrier layers.

FIG. 7 shows the thermal conductivities of converter carrier layers. The converter carrier layers have a thickness of 1.0 to 1.6 mm and an area of 10 mm×10 mm. The y-axis plots thermal conductivity in W/mK and the x-axis plots temperature T in ° C.

The thermal conductivities provided with the reference numerals VIII to XI are allocated to converter carrier layers, consisting of various inorganic-organic hybrid materials. The inorganic-organic hybrid materials are produced from a compound of Formulae I' or I" and 3-isocyanatopropyltriethoxysilane and 50 percent by volume LuAG-converter particles having a diameter of 5 to 15 µm, e.g., 10 µm.

It is evident that the converter carrier layers comprising the inorganic-organic hybrid materials (VIII, IX, X, XI) have a thermal conductivity at least more than five times as high compared to converter carrier layers consisting of silicone and converter particles (II, FIG. 3). Furthermore, the inorganic-organic hybrid materials are characterized by very high yellowing stability when exposed to electromagnetic radiation, which can be attributed to the very stable urethane groups.

Our devices and methods are not limited by the description using the examples but rather includes any new feature and any combination of features included in particular in any combination of features in the appended claims, even if the feature or combination itself is not explicitly stated in the claims or examples.

The invention claimed is:

1. An optoelectronic device comprising:
a layer sequence having an active layer that emits electromagnetic primary radiation;
at least one converter carrier layer arranged in the beam path of the electromagnetic primary radiation,
wherein 1) the at least one converter carrier layer comprises converter particles and an inorganic-organic hybrid material produced by hydrolysis, mutual condensation and crosslinking at least of a compound of formula I' or I" and at least one compound of formula II:

where M and M' are the same or different and can represent a central atom with the charge m or m',
where R and R' are the same or different and represent hydrogen and/or an organic residue,
where Y represents an organic residue having a reactive group suitable for crosslinking,
where x=m,
where $0<n \leq m'$, $1<x' \leq m'$ and $x'+n=m'$,
where a=2, 3, 4, 5, 6, 7 or 8,
where b and b' are the same or different and b, b'=1, 2, 3, 4, 5, 6, 7 or 8, 2) the converter particles are distributed in the inorganic-organic hybrid material and 3) the converter particles convert the electromagnetic primary radiation at least partially into electromagnetic secondary radiation.

2. The optoelectronic device according to claim 1, wherein the converter carrier layer has a thermal conductivity of 0.2 W/mK to 10.0 W/mK.

3. The optoelectronic device according to claim 1, wherein M and M' are selected from the group consisting of B, Al, Si, Ti, Zr and Zn.

4. The optoelectronic device according to claim 1, wherein the reactive group suitable for crosslinking is selected from the group consisting of fluorine, chlorine, bromine, iodine, amino, amide, aldehyde, keto, carboxy, thiol, hydroxy, acryloxy, methacryloxy, epoxy, isocyanate, ester, sulfonic acid, phosphoric acid and vinyl substituents.

5. The optoelectronic device according to claim 1, wherein the converter particles are bonded by chemical bonds to the inorganic-organic hybrid material.

6. The optoelectronic device according to claim 1, wherein the converter carrier layer is free of pores and cracks.

7. The optoelectronic device according to claim 1, wherein the converter particles have a particle diameter of 1 to 50 µm.

8. The optoelectronic device according to claim 1, wherein the converter carrier layer is formed as a casting compound and/or as a platelet, provided above the layer sequence.

9. The optoelectronic device according to claim 8, wherein an adhesive layer is arranged between the layer sequence and the platelet.

10. A method of producing an optoelectronic device comprising a converter carrier layer having a thermal conductivity of 0.2 W/mK to 10.0 W/mK, and the converter carrier layer is a casting compound, the method comprising:
   A) forming a housing having a recess,
   B) introducing a layer sequence having an active layer, which emits electromagnetic primary radiation, into the recess of the housing,
   C) mixing converter particles, and
   Ca) at least one compound of formula I' or I" and at least one compound of formula II:

where M and M' are the same or different and can represent a central atom with the charge m or m',
where R and R' are the same or different and represent hydrogen and/or an organic residue,
where Y represents an organic residue having a reactive group suitable for crosslinking,
where x=m and
where 0<n<m', 1<x'<m' and x'+n=m',
where a=2, 3, 4, 5, 6, 7 or 8,
where b and b' are the same or different and b, b'=1, 2, 3, 4, 5, 6, 7 or 8 and/or
Cb) salts and esters of Si(OH)$_4$ and at least one compound selected from the group consisting of Al$_2$O$_3$, Bi$_2$O$_3$, P$_2$O$_3$, Sc$_2$O$_3$ and Y$_2$O$_3$,
D) introducing the mixture into the recess,
E) hydrolyzing and condensing the compounds stated in Ca) and/or Cb),
F) crosslinking the compounds produced in E).

11. A method of producing an optoelectronic device comprising a converter carrier layer having a thermal conductivity of 0.2 W/mK to 10.0 W/mK, and the converter carrier layer is a platelet, the method comprising:
   A) forming a housing having a recess,
   B) introducing a layer sequence having an active layer which emits electromagnetic primary radiation, into the recess of the housing,
   C') producing a plate comprising C) mixing converter particles and
   Ca) at least one compound of formula I' or I" and at least one compound of formula II:

where M and M' are the same or different and can represent a central atom with the charge m or m',
where R and R' are the same or different and represent hydrogen and/or an organic residue,
where Y represents an organic residue having a reactive group suitable for crosslinking,
where x=m and
where 0<n<m', 1<x'<m' and x'+n=m',
where a=2, 3, 4, 5, 6, 7 or 8,
where b and b' are the same or different and b, b'=1, 2, 3, 4, 5, 6, 7 or 8 and/or
Cb) salts and esters of Si(OH)$_4$ and at least one compound selected from the group consisting of Al$_2$O$_3$, Bi$_2$O$_3$, P$_2$O$_3$, Sc$_2$O$_3$ and Y$_2$O$_3$,
D') introducing the mixture into a two-dimensional mold,
E) hydrolyzing and condensing the compounds stated in Ca) and/or Cb),
F) crosslinking the compounds produced in E),
G) separating the plate to form a plurality of platelets, and
H) applying the platelet above the layer sequence.

12. The method according to claim 11, wherein method step E) takes place at a temperature of 20° C. to 150° C.

* * * * *